(12) United States Patent
Chen et al.

(10) Patent No.: US 10,468,149 B2
(45) Date of Patent: Nov. 5, 2019

(54) EXTREME ULTRAVIOLET MIRRORS AND MASKS WITH IMPROVED REFLECTIVITY

(71) Applicant: GLOBALFOUNDRIES Inc., Grand Cayman (KY)

(72) Inventors: Yulu Chen, Troy, NY (US); Francis Goodwin, Halfmoon, NY (US); Jed Rankin, Richmond, VT (US); Lei Sun, Albany, NY (US); Obert Reeves Wood, II, Loudonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 133 days.

(21) Appl. No.: 15/424,200

(22) Filed: Feb. 3, 2017

(65) Prior Publication Data

US 2018/0226166 A1 Aug. 9, 2018

(51) Int. Cl.
*G02B 5/08* (2006.01)
*G02B 5/20* (2006.01)
(Continued)

(52) U.S. Cl.
CPC ............ *G21K 1/062* (2013.01); *G02B 5/085* (2013.01); *G02B 5/0891* (2013.01);
(Continued)

(58) Field of Classification Search
CPC .... G02B 5/208; G02B 5/0891; C03C 17/366; H01L 2924/00; H01L 2924/0002;
(Continued)

(56) References Cited

U.S. PATENT DOCUMENTS 5,528,654 A * 6/1996 Niibe .................... B82Y 10/00
378/84
6,048,742 A * 4/2000 Weyburne ......... H01L 21/67253
438/16
(Continued)

OTHER PUBLICATIONS

Jose Trull, Crina Cojocaru, Josep Massaneda, Ramon Vilaseca, and Jordi Martorell, "Determination of refractive indices of quarter-wavelength Bragg reflectors by reflectance measurements in wavelength and angular domains," (2002), Appl. Opt. 41, 5172-5178 (Year: 2002).*

*Primary Examiner* — William R Alexander
*Assistant Examiner* — Tamara Y. Washington
(74) *Attorney, Agent, or Firm* — Thompson Hine LLP; Anthony Canale

(57) ABSTRACT

Extreme ultraviolet mirrors and masks used in lithography and methods for manufacturing an extreme ultraviolet mirror or mask. Initial data is obtained that includes materials and optical properties for a first intermixed layer, a second intermixed layer, a first pure layer, and a second pure layer in each of a plurality of periods of a multi-layer stack for an optical element. For multiple thicknesses for the first pure layer and multiple thicknesses for the second pure layer, a reflectivity of the multi-layer stack is determined based on the initial data, a thickness received for the first intermixed layer, and a thickness received for the second intermixed layer. One of the thicknesses for the first pure layer and one of the thicknesses for the second pure layer are selected that maximize the reflectivity of the multi-layer stack.

8 Claims, 4 Drawing Sheets

(51) Int. Cl.
*F21V 9/04* (2018.01)
*F21V 9/06* (2018.01)
*G21K 1/06* (2006.01)
*G03F 1/24* (2012.01)
*G02B 27/00* (2006.01)
*G03F 7/20* (2006.01)
*G01M 11/00* (2006.01)

(52) U.S. Cl.
CPC ........... *G02B 27/0012* (2013.01); *G03F 1/24* (2013.01); *G03F 7/70316* (2013.01); *G03F 7/70958* (2013.01); *G01M 11/005* (2013.01); *G21K 2201/067* (2013.01)

(58) Field of Classification Search
CPC ........... H01L 2924/00014; H01L 22/12; H01L 2224/48091
USPC ......... 359/350–361, 381; 438/7, 16, 29, 314
See application file for complete search history.

(56) References Cited

U.S. PATENT DOCUMENTS

| | | | | |
|---|---|---|---|---|
| 8,940,463 | B2* | 1/2015 | Deweerd | G03F 1/22 430/5 |
| 10,055,833 | B2* | 8/2018 | Peters | G03F 1/84 |
| 2002/0012797 | A1* | 1/2002 | Bijkerk | B82Y 10/00 428/408 |
| 2002/0089739 | A1* | 7/2002 | Takizawa | B82Y 10/00 359/359 |
| 2002/0114089 | A1* | 8/2002 | Dinger | G02B 17/0663 359/853 |
| 2002/0171922 | A1* | 11/2002 | Shiraishi | G02B 5/08 359/359 |
| 2004/0121134 | A1* | 6/2004 | Bijkerk | B82Y 10/00 428/212 |
| 2005/0026046 | A1 | 2/2005 | Yan | |
| 2005/0122593 | A1* | 6/2005 | Johnson | B82Y 10/00 359/650 |
| 2006/0245057 | A1* | 11/2006 | Van Herpen | B82Y 10/00 359/587 |
| 2007/0188870 | A1* | 8/2007 | Miyake | B82Y 10/00 359/580 |
| 2007/0281109 | A1* | 12/2007 | Bijkerk | G02B 1/105 427/593 |
| 2007/0285643 | A1* | 12/2007 | Wedowski | G01B 11/0625 355/67 |
| 2007/0287076 | A1* | 12/2007 | Masaki | B82Y 10/00 430/5 |
| 2008/0165415 | A1* | 7/2008 | Chan | G02B 5/0891 359/351 |
| 2009/0284728 | A1* | 11/2009 | Van Empel | B82Y 10/00 355/71 |
| 2009/0305147 | A1* | 12/2009 | Constancias | G03F 1/24 430/5 |
| 2012/0086800 | A1* | 4/2012 | Vladimirsky | B82Y 10/00 348/128 |
| 2012/0170012 | A1* | 7/2012 | Masaki | G02B 5/0816 355/67 |
| 2013/0230073 | A1* | 9/2013 | Vogt | G01K 11/00 374/45 |
| 2014/0285783 | A1* | 9/2014 | Dinger | B82Y 10/00 355/67 |
| 2015/0316851 | A1* | 11/2015 | Wabra | G02B 5/0816 359/359 |
| 2016/0048083 | A1* | 2/2016 | Endres | G03F 7/702 355/67 |
| 2016/0181134 | A1* | 6/2016 | Budiarto | H01L 22/12 438/7 |
| 2017/0317471 | A1* | 11/2017 | Lor | G02B 6/124 |
| 2018/0137948 | A1* | 5/2018 | Ichimaru | G02B 5/08 |
| 2018/0341179 | A1* | 11/2018 | Enkisch | G02B 5/0891 |
| 2019/0079383 | A1* | 3/2019 | Ikebe | G03F 1/24 |

* cited by examiner

EXTREME ULTRAVIOLET MIRRORS AND MASKS WITH IMPROVED REFLECTIVITY

BACKGROUND

The present invention relates to integrated circuit fabrication and, more specifically, to optical elements, such as extreme ultraviolet mirrors and masks, used in lithography and methods for manufacturing an optical element, such as an extreme ultraviolet mirror or mask.

Semiconductor chips may be manufactured using processes that involve lithography. Immersion lithography is a lithography technique that uses ultraviolet light with a wavelength equal to 193 nanometers; and the wafer is immersed in water for improved resolution. Extreme ultraviolet (EUV) lithography is a technique that has been explored to extend lithographic technology beyond the optical limits of immersion lithography to pattern small critical dimension features. Extreme ultraviolet lithography employs radiation in the extreme ultraviolet (EUV) region of the electromagnetic spectrum that has a shorter wavelength, e.g., 13.5 nanometers, than in immersion lithography.

A EUV scanner directs EUV radiation from a EUV source to expose a resist layer on a wafer. The EUV scanner relies on optical elements, e.g., mirrors and a mask, that are reflective rather than the refractive optical elements, i.e., lenses, traditionally found in an immersion lithography system. For example, a EUV scanner may include multiple condenser mirrors, multiple projection mirrors, and a mask as optical elements. The optical elements of a EUV scanner include a multi-layer structure with periods consisting of silicon and molybdenum bi-layers, and reflection from the multi-layer structure of each optical element occurs by the mechanism of Bragg interference. The multi-layer structure of each optical element absorbs a fraction (e.g., 30 percent) of the incident EUV radiation and reflects the remainder of the incident EUV radiation, which is a disadvantage due to the number of mirrors that are present in the EUV scanner.

SUMMARY

According to an embodiment, a method includes obtaining initial data including materials and optical properties for a first intermixed layer, a second intermixed layer, a first pure layer, and a second pure layer in each of a plurality of periods of a multi-layer stack for an optical element, as well as obtaining a thickness for the first intermixed layer and a thickness for the second intermixed layer. The method further includes determining a reflectivity of the multi-layer stack based on the initial data, the thickness for the first intermixed layer, and the thickness for the second intermixed layer determined for a plurality of thicknesses for the first pure layer and a plurality of thicknesses for the second pure layer. The method further includes selecting a combination of one of the thicknesses for the first pure layer and one of the thicknesses for the second pure layer that maximizes the reflectivity of the multi-layer stack.

According to an embodiment, a system includes one or more computer processors and a memory storing instructions that, upon execution by the one or more computer processors, cause the system to receive initial data including materials and optical properties for a first intermixed layer, a second intermixed layer, a first pure layer, and a second pure layer in each of a plurality of periods of a multi-layer stack for an optical element, and receive a thickness for the first intermixed layer and a thickness for the second intermixed layer. A reflectivity of the multi-layer stack is determined based on the initial data, the thickness for the first intermixed layer, and the thickness for the second intermixed layer for a plurality of thicknesses for the first pure layer and a plurality of thicknesses for the second pure layer. A combination of one of the thicknesses for the first pure layer and one of the thicknesses for the second pure layer is selected that maximizes the reflectivity of the multi-layer stack.

According to an embodiment, an optical element includes a Bragg mirror on a substrate. The Bragg mirror includes a multi-layer stack with a plurality of periods, each of the periods including a first intermixed layer with a thickness, a second intermixed layer with a thickness, a first pure layer, and a second pure layer. The first pure layer and the second pure layer have respective thicknesses that are selected to maximize a reflectivity of the multi-layer stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
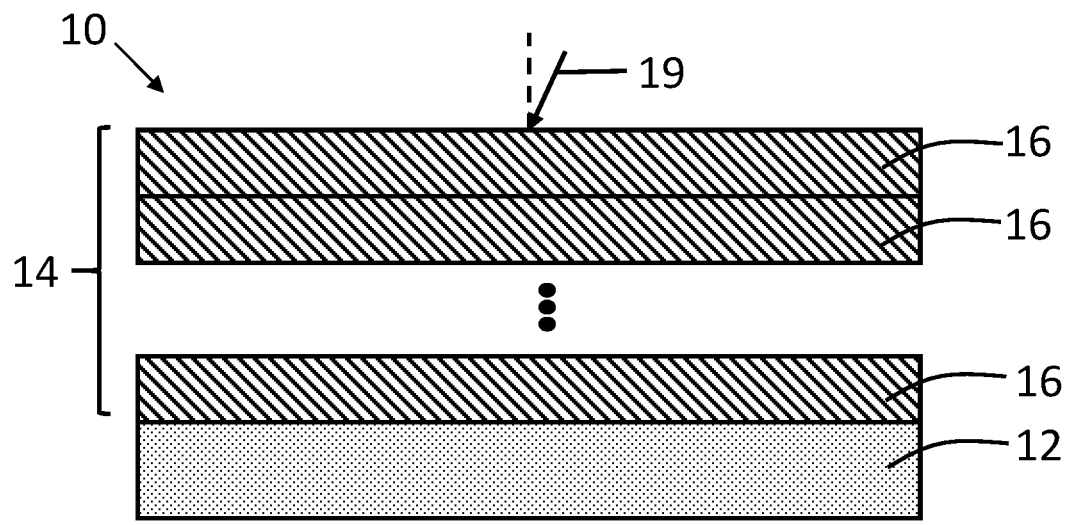
FIG. 1 is a cross-sectional view of an optical element in accordance with embodiments of the invention.

With reference to FIG. 1 and in accordance with embodiments of the invention, a Bragg reflector 10 for use in an extreme ultraviolet (EUV) optical system includes a substrate 12 that is coated with a multi-layer stack 14 that includes a plurality of periods 16. The number of individual periods 16 in the multi-layer stack 14 may be, for example, twenty (20), and each period 16 may have a thickness of, for example, seven (7) nanometers. The substrate 12 may be composed of a material that is characterized by relatively low thermal expansion, such as silicon dioxide ($SiO_2$).

The Bragg reflector 10 may be used as an optical element in a EUV scanner. In particular, the Bragg reflector 10 may be used as a mirror that is arranged along with other mirrors to reflect EUV radiation from a source of EUV radiation to expose a resist layer on a wafer. The mechanism for reflection of incident EUV radiation from the multi-layer stack 14 of the Bragg reflector 10 is Bragg interference.

As diagrammatically shown in FIG. 1, rays 19 of EUV radiation may be incident with a chief ray angle of incidence at object (CRAO) relative to the flat front surface of the Bragg reflector 10 and, therefore, have non-normal incidence relative to the flat front surface of the Bragg reflector 10. For a given CRAO, the thickness of the multi-layer stack 14 and its periods 16 may be adjusted to maximize constructive interference for light reflected at different interfaces of the multi-layer stack 14.

Figure 2:
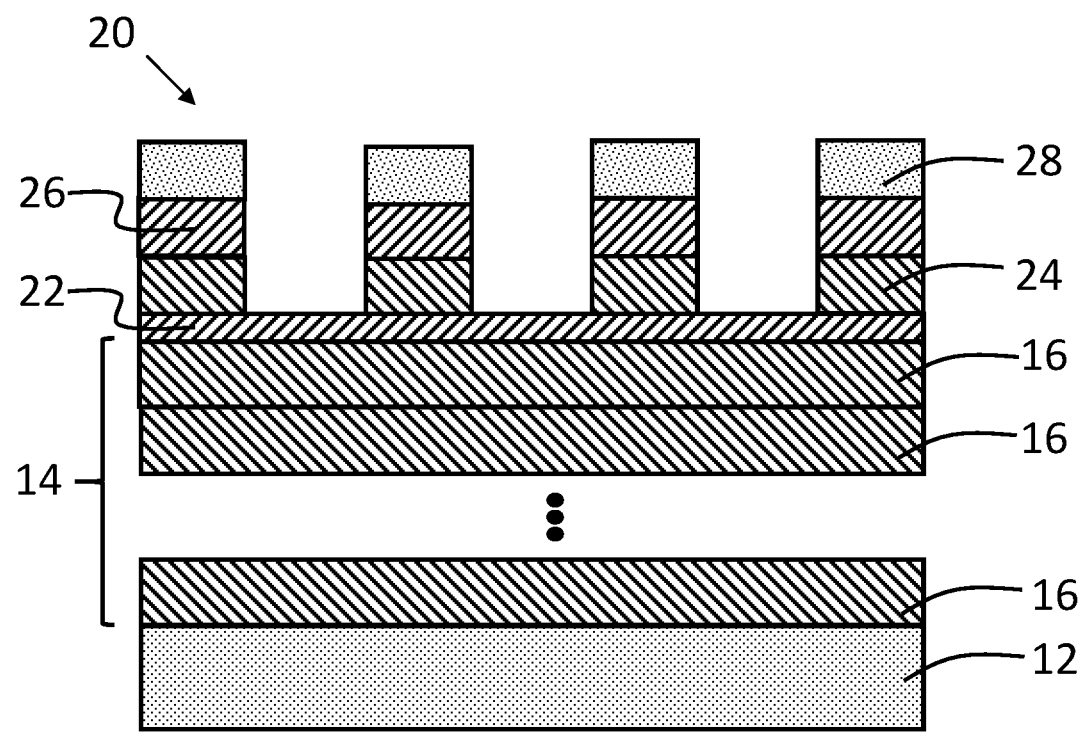
FIG. 2 is a cross-sectional view of an optical element in accordance with embodiments of the invention.

With reference to FIG. 2 in which like reference numerals refer to like features in FIG. 1 and at a subsequent fabrication stage in accordance with embodiments of the invention, the Bragg reflector 10 may be used as a mask blank to fabricate a EUV mask 20. To that end, an etch stop layer 22 may be deposited on the topmost period 16 of the multi-layer stack 14, followed by the deposition of an absorber layer 24 and an anti-reflection coating 26. The etch stop layer 22 may be constituted by ruthenium (Ru). A resist layer 28 is applied and patterned with features characterizing a design of a layer of a chip. The resist constituting the resist layer 28 may be sensitive to exposure by an electron beam, and an electron beam writing tool may be used to pattern the resist layer 28. The absorber layer 24 and anti-refection coating 26 are patterned by etching to transfer the features of the layer design from the resist layer 28 to the absorber layer 24 so as to form absorber features arranged in the layer design. The resist layer 28 is subsequently stripped to complete mask fabrication. The EUV mask 20 may then be used in a EUV scanner to transfer the layer design embodied in the absorber features from the EUV mask 20 to a resist layer on a semiconductor wafer.

Figure 3:
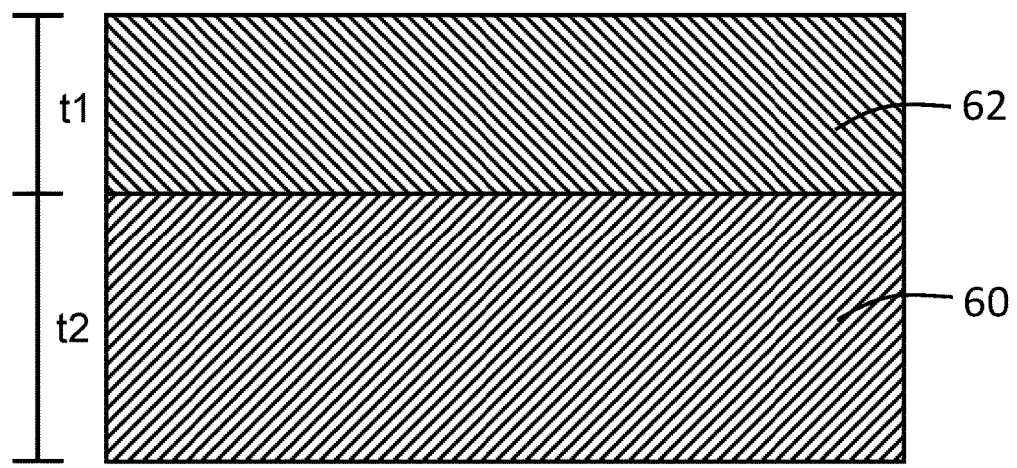
FIG. 3 is a cross-sectional view of the as-deposited layers for one of the periods of the multi-layer stack included in the optical elements of FIGS. 1 and 2.

With reference to FIG. 3 in which like reference numerals refer to like features in FIG. 1, a layer 60 and a layer 62 are deposited in an alternating fashion to form the multi-layer stack 14. The periods 16 of the multi-layer stack 14 is formed from the as-deposited layers 60, 62. The material deposited to form the layers 60 is selected so as to have different optical properties, such as a different refractive index to EUV radiation, than the material deposited to form layers 62. For example, the material constituting the layers 60 may have a refractive index to EUV radiation that is greater than the refractive index to EUV radiation of the material constituting the layers 62. The refractive index of a material, such as the materials of layer 60 and layer 62, is a dimensionless complex number that describes how electromagnetic radiation propagates through an absorbing medium, and in which the imaginary part accounts for attenuation and the real part accounts for refraction.

The materials deposited to form the layers 60 and the layers 62 may contain a single element from the Periodic Table. In an embodiment, the material deposited to form the layers 60 may be silicon (Si) and the material deposited to form the layers 62 may be molybdenum (Mo) such that the periods 16 include molybdenum-silicon (Mo—Si) layer pairs (e.g., a layer of molybdenum above or below a layer of silicon in each layer pair). The layers 60, 62 may be deposited by physical vapor deposition (PVD), chemical vapor deposition (CVD), atomic layer deposition (ALD), or another technique with the intent to have respective deposition thicknesses, t1 and t2. The as-deposited layers 60, 62 are formed under a given set of deposition conditions (e.g., time, temperature, pressure) that influences layer intermixing. The multi-layer stack 14 lacks any layers that would be considered to constitute a diffusion barrier and, to the contrary, the intermixing from diffusion is taken into account when optimizing reflectivity as described hereinbelow.

Figure 4:
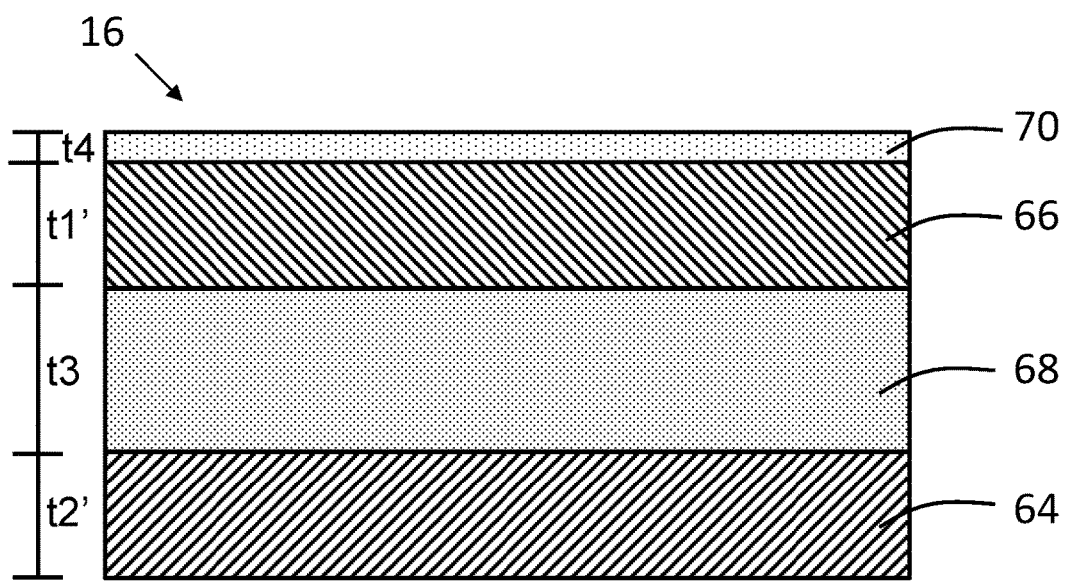
FIG. 4 is a cross-sectional view of the pure and intermixed layers of one of the periods of the multi-layer stack included in the optical elements of FIGS. 1 and 2.

With reference to FIG. 4 in which like reference numerals refer to like features in FIG. 3, each period 16 of the multi-layer stack 14 includes pure layers 64, 66 and intermixed layers 68, 70 that are the result of intermixing between adjacent pairs of as-deposited layers 60, 62. The intermixing may occur in association with the deposition of the layers 60, 62. For example, in association with the deposition of each layer 62 on one of the layers 60, intermixing occurs between the layer 62 being deposited and the previously-deposited layer 60. Similar considerations apply in association with the deposition of each layer 60 on one of the layers 62.

The pure layer 64 may have the same composition as the as-deposited layer 60, and the pure layer 66 may have the same composition as the as-deposited layer 62. In an embodiment, each pure layer 64 may contain a single element from the Periodic Table if the as-deposited layer 60 likewise contains that single element, and each pure layer 66 may contain a single element from the Periodic Table if the as-deposited layer 62 likewise contains that single element. Each pure layer 64, which has the same composition as the as-deposited layer 60, is characterized by the same optical properties, such as refractive index to EUV radiation, as layer 60. Due to the intermixing, each pure layer 64 has a reduced thickness t1' that is a fraction of the thickness of the as-deposited layer 60. Each pure layer 66, which has the same composition as as-deposited layer 62, is characterized by the same optical properties, such as refractive index to EUV radiation, as layer 62. Due to the intermixing, each pure layer 66 has a reduced thickness t2' that is a fraction of the thickness of the as-deposited layer 62, and that results from the intermixing.

Each of the intermixed layers 68, 70 is located between one of the pure layers 64 and one of the pure layers 66. Intermixed layer 68 is located vertically in the multi-layer stack 16 between pure layer 64 and pure layer 66, and intermixed layer 70 is located vertically in the multi-layer stack 16 between pure layer 66 and the pure layer 64 of the adjacent period 16. The intermixed layer 68 may have a thickness t3 and the intermixed layer 70 may have a thickness t4 that is different from the thickness of the intermixed layer 68. For example, the intermixed layer 68 may be thicker than the intermixed layer 70 because of, for example, differences in deposition energy effects. The thicknesses of the intermixed layers 68, 70 may vary with the deposition conditions under which the layers 60, 62 are deposited.

The composition of the intermixed layers 68, 70 includes a contribution from the material of one of the as-deposited layers 60 and a contribution from the material of one of the as-deposited layers 62. For example, if the layers 60 are composed of silicon (Si) and the layers 62 are composed of molybdenum (Mo), then the material constituting the intermixed layers 68, 70 may be an alloy of silicon (Si) and molybdenum (Mo).

The material of the intermixed layer 68 has optical properties, such as refractive index to EUV radiation, that are different than the optical properties of either of the pure layers 64, 66. Similarly, the material of the intermixed layer 70 has optical properties, such as refractive index to EUV radiation, that are different than the optical properties of either of the pure layers 64, 66. In an embodiment, the materials of the intermixed layers 68, 70 and their respective optical properties may be identical.

Figure 5:
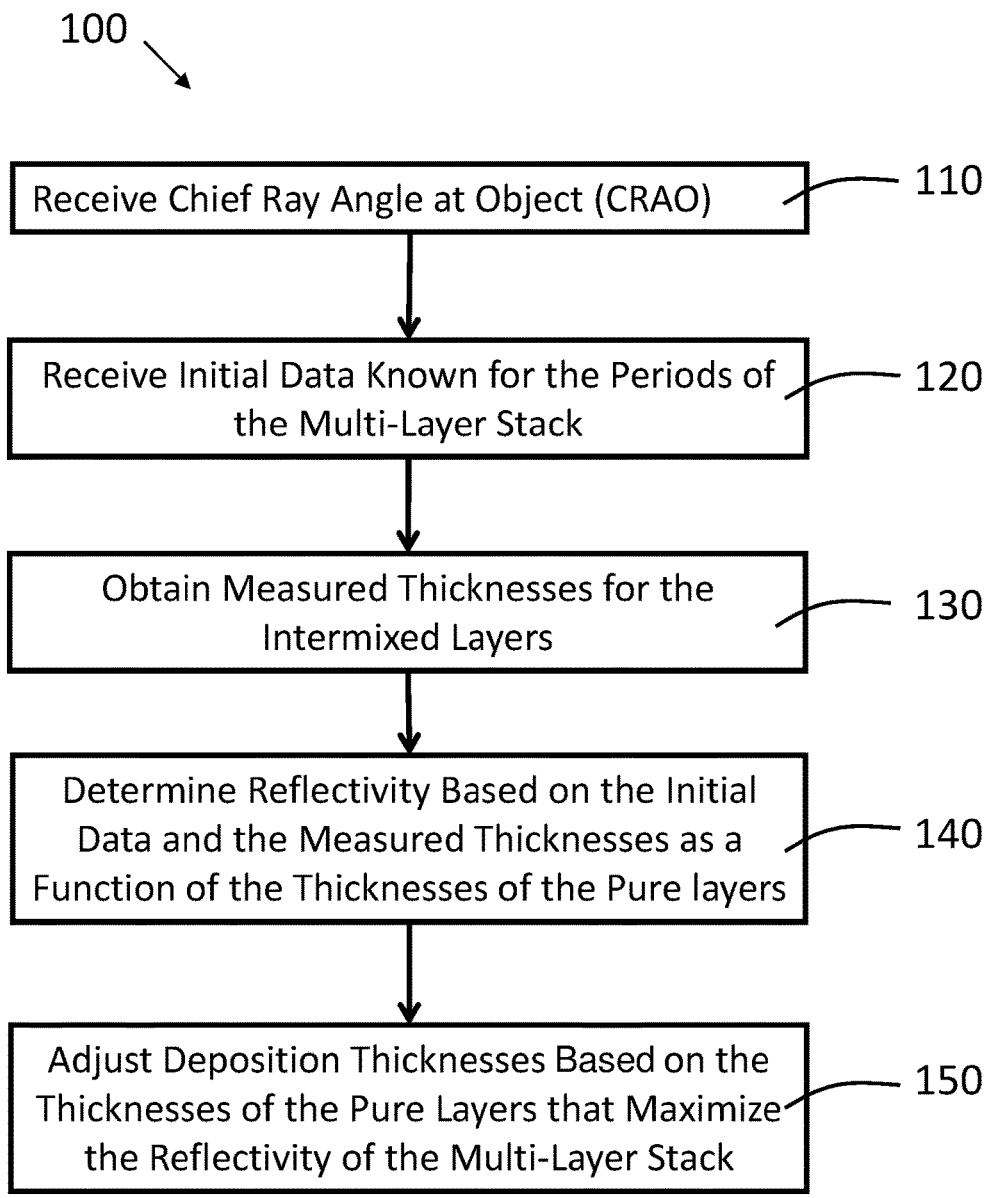
FIG. 5 is a flow chart for a process in accordance with embodiments of the invention to optimize the construction of the multi-layer structure included in the optical elements of FIGS. 1 and 2.

With reference to FIG. 5, a process 100 is described for optimizing the reflectivity of a multi-layer stack 14 for a Bragg reflector 10 or EUV mask 20 that is to be manufactured. The layer optimization system considers intermixing as part of the optimization process.

In block 110, the chief ray angle at the object (CRAO) is determined or specified, and supplied to the layer optimization system. The CRAO may be, for example, in a range of 2° to 10°, and may be determined or specified based on the placement and orientation of the Bragg reflector 10 or EUV mask 20 in the EUV scanner.

In block 120, the layer optimization system receives or obtains initial data for the periods 16 of the multi-layer stack 14. The initial data may include, among other known data, the materials and optical properties (e.g., refractive index) for the pure layers 64, 66 in each period 16 and the materials and optical properties (e.g., refractive index) for the intermixed layers 68, 70 in each period 16. The data for materials and optical properties may be retrieved from values stored in a database. The materials and optical properties for the pure layers 64, 66 are equal to the optical properties for the as-deposited layers 60, 62. The optical properties for the intermixed layers 66, 68 in the initial may be determined based on the optical properties of the pure layers 64, 66. For example, the real and imaginary parts of the refractive index to EUV radiation for the intermixed layers 66, 68 may be given by the respective averages for the real and imaginary parts of the refractive indices to EUV radiation of the pure layers 64, 66.

In block 130, the layer optimization system obtains or receives measured thicknesses for the intermixed layers 68, 70 formed under a given fixed set of deposition conditions (e.g., time, temperature, pressure) for the as-deposited layers 60, 62. The values for the measured thicknesses of the intermixed layers 68, 70 may be based on historical measurements. In an embodiment, the thicknesses of the intermixed layers 68, 70 for multi-layered stacks 14 deposited under different deposition conditions may be measured, for example, using techniques of transmission electron microscopy. From these measurements, a database of thicknesses for the intermixed layers 68, 70 may be established that includes a table of measured thicknesses under different deposition conditions. Given a set of deposition conditions as an input to the layer optimization system, the table in the database may be consulted to obtain the corresponding thicknesses for the intermixed layers 68, 70.

Alternatively, the table in the database may include fitted thicknesses for the intermixed layers 68, 70 formed under different sets of deposition conditions for the as-deposited layers 60, 62. To that end, the actual reflectivity for the intermixed layers 68, 70 of multi-layered stacks 14 deposited under various different deposition conditions can be experimentally measured for multiple values of the CRAO (e.g., 50 different values of CRAO). Fitted thicknesses for the intermixed layers 68, 70 may be determined by matching a calculated reflectivity to the observed reflectivity from the measurements.

In block 140, the layer optimization system may perform calculations to optimize the thicknesses of the pure layers 64, 66, after deposition, diffusion, and intermixing, to achieve the maximum reflectivity from the multi-layer stack 14 at CRAO for a Bragg mirror or EUV mask that is to be manufactured. The reflectivity from the multi-layer stack 14 may be calculated by simulations using the transfer-matrix method with an awareness of the intermixing. The transfer-matrix method is a method used in optics to analyze the propagation of electromagnetic waves through a stratified (i.e., layered) medium, such as the periods 16 of layers 64, 66, 68, 70 in the multi-layer stack 14. The source of electromagnetic radiation in the calculations is assumed to be a plane wave with a given polarization, and is incident on the multi-layer stack 14 of FIG. 4 at an angle of incidence given by the CRAO. In each of the layers 64, 66, 68, 70 of one of the periods 16, there are two plane waves, one plane wave traveling forward and one plane wave traveling backward. The propagation direction of these plane waves can be found by Snell's law. At an interface between each pair of the layers 64, 66, 68, 70, the tangential components of the electric and magnetic fields associated with the plane waves must satisfy certain boundary conditions. These boundary conditions can be incorporated into two-by-two (2×2) matrices describing how electromagnetic waves propagate in each of the layers 64, 66, 68, 70, and how electromagnetic waves refract and reflect at the interfaces between the layers 64, 66, 68, 70. Multiplying all matrices yields a complete model of a system characterizing the multi-layer stack 14. For the given incident angle and polarization of the light, a reflection coefficient specifying the reflectivity can be found by solving the matrix equations.

The initial data, along with the additional input data relating to the thicknesses of the intermixed layers 68, 70, is used by the layer optimization system to compute reflectivity. The known material parameters (e.g., thickness and optical properties) of the layers 64, 66, 68, 70 in the initial data are inputs to the transfer matrices. Unknown material properties determined by the calculation are the thicknesses of pure layers 64, 66. To that end, the thicknesses of pure layers 64, 66 may be varied in small increments in successive calculations of the reflection coefficient (i.e., reflectivity) until a combination of the thicknesses of pure layers 64, 66 is determined that results in a maximum reflectivity.

In an alternative embodiment, one or both of the intermixed layers 68, 70 may be divided into multiple sub-layers with different optical properties for purposes of the calculation. For example, each of the intermixed layers 68 may divided into three sub-layers in which the center sub-layer is considered in the calculation to have the optical properties of the intermixed composition, the sub-layer closest to pure layer 64 is considered in the calculation to have optical properties between the optical properties for the intermixed composition and the optical properties for the composition of the pure layer 64, and the sub-layer closest to pure layer 66 is considered in the calculation to have optical properties between the optical properties for the intermixed composition and the optical properties for the composition of the pure layer 66. The optical properties for the sub-layer closest to pure layer 64 and the sub-layer closest to pure layer 66 may be determined by averaging.

In block 150, the deposition thicknesses of the as-deposited layers 60, 62 are adjusted based on the output from the calculations in block 140 in order to provide the maximum reflectivity for the multi-layer stack 14 that is to be manufactured. Following diffusion and intermixing, the thicknesses of the pure layers 64, 66 in the multi-layer stack 14 should be near the optimized thicknesses determined in block 140.

Figure 6:
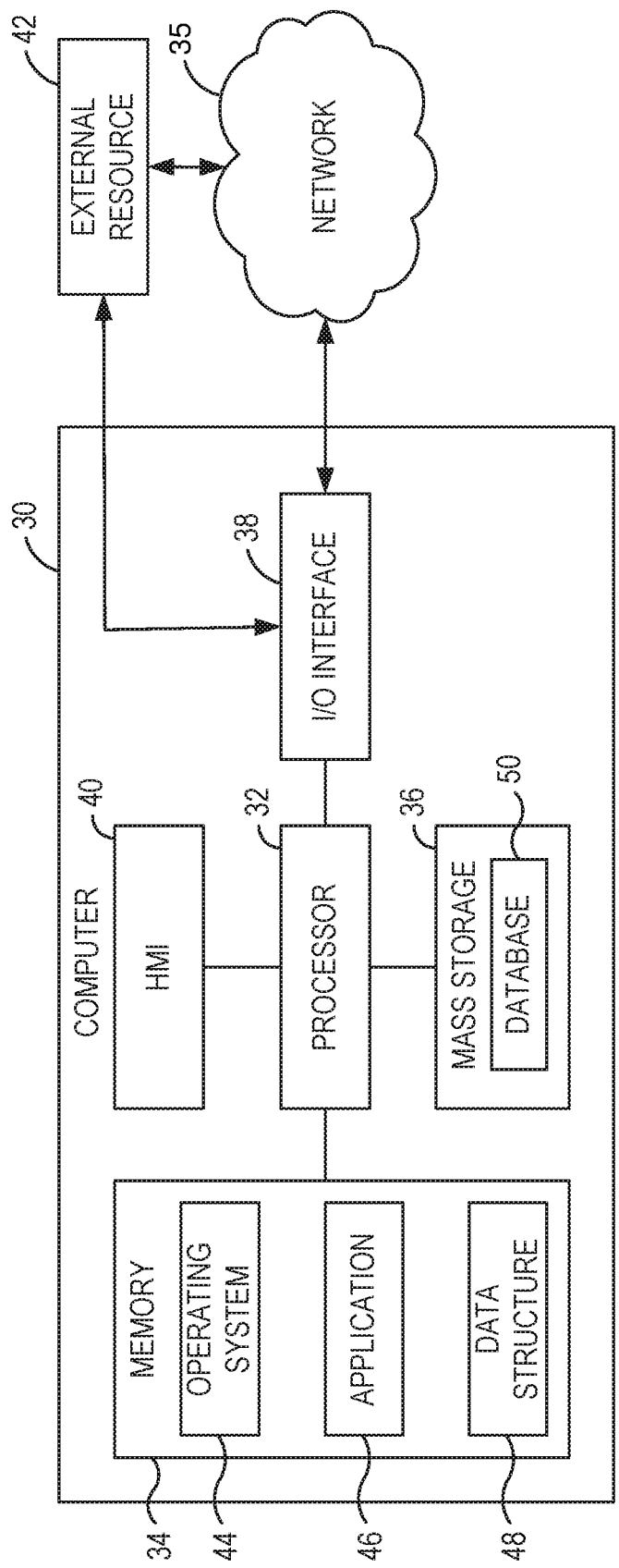
FIG. 6 is a diagrammatic view of an exemplary computer that may be used to provide an operating environment for the layer optimization system performing the process of FIG. 5.

Referring now to FIG. 6, the layer optimization system may be implemented on one or more computer devices or systems, such as an exemplary computer 30. The computer 30 may include a processor 32, a memory 34, a mass storage memory device 36, an input/output (I/O) interface 38, and a Human Machine Interface (HMI) 40. The computer 30 may also be operatively coupled to one or more external resources 42 via a network 35 or I/O interface 38. External resources may include, but are not limited to, servers, databases, mass storage devices, peripheral devices, cloud-based network services, or any other suitable computer resource that may be used by the computer 30.

The processor 32 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in memory 34. Memory 34 may include a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or any other device capable of storing data. The mass storage memory device 36 may include data storage devices such as a hard drive, optical drive, tape drive, volatile or non-volatile solid state device, or any other device capable of storing data.

The processor 32 may operate under the control of an operating system 44 that resides in memory 34. The operating system 44 may manage computer resources so that computer program code embodied as one or more computer software applications, such as an application 46 residing in memory 34, may have instructions executed by the processor 32. The processor 32 may also execute the application 46 directly, in which case the operating system 44 may be omitted. The one or more computer software applications may include a running instance of an application comprising a server, which may accept requests from, and provide responses to, one or more corresponding client applications. The application 46 may provide algorithms used, as described herein, to optimize the reflectivity of the Bragg reflector 10 with the intermixing considered in the optimization.

One or more data structures 48 may also reside in memory 34, and may be used by the processor 32, operating system 44, and/or application 46 to store and/or manipulate data. The application 46 may store the results of the modeling and computer simulations as data structures in the memory 34.

The I/O interface 38 may provide a machine interface that operatively couples the processor 32 to other devices and systems, such as the network 35 or external resource 42. The application 46 may thereby work cooperatively with the network 35 or external resource 42 by communicating via the I/O interface 38 to provide the various features, functions, applications, processes, or modules comprising embodiments of the invention. The application 46 may also have program code that is executed by one or more external resources 42, or otherwise rely on functions or signals provided by other system or network components external to the computer 30. Indeed, given the nearly endless hardware and software configurations possible, it should be understood that embodiments of the invention may include applications that are located externally to the computer 30, distributed among multiple computers or other external resources 42, or provided by computing resources (hardware and software) that are provided as a service over the network 35, such as a cloud computing service.

The HMI 40 may be operatively coupled to the processor 32 of computer 30 to enable a user to interact directly with the computer 30. The HMI 40 may include video or alphanumeric displays, a touch screen, a speaker, and/or any other suitable audio and visual indicators capable of providing data to the user. The HMI 40 may also include input devices and controls such as an alphanumeric keyboard, a pointing device, keypads, pushbuttons, control knobs, microphones, etc., capable of accepting commands or input from the user and transmitting the entered input to the processor 32.

A database 50 may reside on the mass storage memory device 36, and may be used to collect and organize data used by the various systems and modules described herein. The database 50 may include data and supporting data structures that store and organize the data. In particular, the database 50 may be arranged with any database organization or structure including, but not limited to, a relational database, a hierarchical database, a network database, an object-oriented database, or combinations thereof. A database management system in the form of a computer software application executing as instructions on the processor 32 may be used to access data stored in records of the database 50 in response to a query, where the query may be dynamically determined and executed by the operating system 44, other applications 46, or one or more modules.

In general, the routines executed to implement the embodiments of the invention, whether implemented as part of an operating system or a specific application, component, program, object, module or sequence of instructions, or a subset thereof, may be referred to herein as "computer program code," or simply "program code." Program code typically comprises computer-readable instructions that are resident at various times in various memory and storage devices in a computer and that, when read and executed by one or more processors in a computer, cause that computer to perform the operations necessary to execute operations and/or elements embodying the various aspects of the embodiments of the invention. Computer-readable program instructions for carrying out operations of the embodiments of the invention may be, for example, assembly language or either source code or object code written in any combination of one or more programming language.

Various program code described herein may be identified based upon the application within which it is implemented in specific embodiments of the invention. However, it should be appreciated that any particular program nomenclature which follows is used merely for convenience, and thus the invention should not be limited to use solely in any specific application identified and/or implied by such nomenclature. Furthermore, given the generally endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the embodiments of the invention are not limited to the specific organization and allocation of program functionality described herein.

The program code embodied in any of the applications/modules described herein is capable of being individually or collectively distributed as a program product in a variety of different forms. In particular, the program code may be distributed using a computer-readable storage medium having computer-readable program instructions thereon for causing a processor to carry out aspects of the embodiments of the invention.

Computer-readable storage media, which is inherently non-transitory, may include volatile and non-volatile, and removable and non-removable tangible media implemented in any method or technology for storage of data, such as computer-readable instructions, data structures, program modules, or other data. Computer-readable storage media may further include random access memory (RAM), read-only memory (ROM), erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired data and which can be read by a computer. A computer-readable storage medium should not be construed as transitory signals per se (e.g., radio waves or other propagating electromagnetic waves, electromagnetic waves propagating through a transmission media such as a waveguide, or electrical signals transmitted through a wire). Computer-readable program instructions may be downloaded to a computer, another type of programmable data processing apparatus, or another device from a computer-readable storage medium or to an external computer or external storage device via a network.

Computer-readable program instructions stored in a computer-readable medium may be used to direct a computer, other types of programmable data processing apparatuses, or other devices to function in a particular manner, such that the instructions stored in the computer-readable medium produce an article of manufacture including instructions that implement the functions, acts, and/or operations specified in the flow-charts, sequence diagrams, and/or block diagrams. The computer program instructions may be provided to one or more processors of a general purpose computer, a special purpose computer, or other programmable data processing apparatus to produce a machine, such that the instructions, which execute via the one or more processors, cause a series of computations to be performed to implement the functions, acts, and/or operations specified in the flow-charts, sequence diagrams, and/or block diagrams.

In certain alternative embodiments, the functions, acts, and/or operations specified in the flow-charts, sequence diagrams, and/or block diagrams may be re-ordered, processed serially, and/or processed concurrently consistent with embodiments of the invention. Moreover, any of the flow-charts, sequence diagrams, and/or block diagrams may include more or fewer blocks than those illustrated consistent with embodiments of the invention.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a substrate, regardless of its actual three-dimensional spatial orientation. Terms such as "vertical" and "normal" refer to a direction perpendicular to the "horizontal" and "lateral" directions. Terms such as "above" and "below" indicate positioning of elements or structures relative to each other and/or to the top surface of the substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an optical element used in lithography, the method comprising:

receiving, at a processor, a first material and a first refractive index for a first intermixed layer, a second material and a second refractive index for a second intermixed layer, a third material and a third refractive index for a first pure layer, and a fourth material and a fourth refractive index for a second pure layer that are stacked in each of a plurality of periods of a multi-layer stack for the optical element;

receiving, at the processor, a first historically-measured thickness for the first intermixed layer and a second historically-measured thickness for the second intermixed layer under a set of deposition conditions;

determining, by computer simulation using the processor, a first thickness of the first pure layer and a second thickness of the second pure layer that maximize a reflectivity of each period of the multi-layer stack based on the first material and the first refractive index for the first intermixed layer, the second material and the second refractive index for the second intermixed layer, the third material and the third refractive index for the first pure layer, the fourth material and the fourth refractive index for the second pure layer, the first historically-measured thickness for the first intermixed layer, and the second historically-measured thickness for the second intermixed layer; and depositing the periods of the multi-layer stack under the set of deposition conditions, each period containing a first deposited layer with a first deposition thickness and a second deposited layer with a second deposition thickness, wherein the first deposition thickness of the first deposited layer is equal to a sum of the first thickness of the first pure layer and the first historically-measured thickness for the first intermixed layer, and the second deposition thickness of the second deposited layer is equal to a sum of the second thickness of the second pure layer and the second historically-measured thickness for the second intermixed layer.

2. The method of claim 1 wherein the computer simulation considers an angle of incidence for rays of electromagnetic radiation given by a chief ray angle at object (CRAO).

3. The method of claim 1 wherein the computer simulation involves the use of a matrix transfer method.

4. The method of claim 1 further comprising:
forming a plurality of absorber features on the multi-layer stack,
wherein the absorber features are arranged in a layer design for a chip.

5. The method of claim 1 further comprising:
allowing the first deposited layer and the second deposited layer in each period of the multi-layer stack to intermix to produce the first intermixed layer, the second intermixed layer, the first pure layer, and the second pure layer.

6. The method of claim 1 wherein the first intermixed layer in each period is divided into a plurality of sublayers, and the first refractive index varies among the sublayers.

7. The method of claim 1 wherein the first pure layer is comprised of silicon, and the second pure layer is comprised of molybdenum.

8. The method of claim 1 wherein the multi-layer stack lacks a diffusion barrier layer.

* * * * *